United States Patent
Konishi

(10) Patent No.: US 6,808,677 B2
(45) Date of Patent: Oct. 26, 2004

(54) APPARATUS FOR FABRICATING POWDERY THERMOELECTRIC MATERIAL AND METHOD OF FABRICATING POWDERY THERMOELECTRIC MATERIAL USING THE SAME

(75) Inventor: Akio Konishi, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/934,546

(22) Filed: Aug. 23, 2001

(65) Prior Publication Data

US 2002/0023328 A1 Feb. 28, 2002

(30) Foreign Application Priority Data

Aug. 31, 2000 (JP) ............................ 2000-262302
Jul. 12, 2001 (JP) ............................ 2001-211484

(51) Int. Cl.$^7$ ................................ C21C 1/00
(52) U.S. Cl. ............................ 266/202; 425/8
(58) Field of Search ............... 266/202; 264/8, 264/14; 425/8

(56) References Cited

U.S. PATENT DOCUMENTS

| | | | | |
|---|---|---|---|---|
| 4,315,720 A | * | 2/1982 | Ueda et al. | .................. 425/8 |
| 4,330,803 A | * | 5/1982 | Karol | ................. 360/98.05 |
| 4,374,074 A | * | 2/1983 | Ueda et al. | .................. 264/8 |
| 5,497,740 A | * | 3/1996 | Thiemeier | ............. 123/188.13 |
| 5,814,573 A | * | 9/1998 | Hogg | ................. 501/98.1 |

OTHER PUBLICATIONS

Tomio Satoh et al., "Application of Plasma Sprayed Ceramic Coatings to the Base Materials of the Rotating Disk in the Centrifugal Atomization Process," in Thermal Spraying vol. 29, No. 2, P15–20 Dec. 1992).

* cited by examiner

Primary Examiner—Scott Kastler
(74) Attorney, Agent, or Firm—Varndell & Varndell, PLLC

(57) ABSTRACT

An apparatus for fabricating a powdery thermoelectric material comprising a rotating disk having durability to thermal shock, having no reactivity with raw material and capable of high speed rotation, the apparatus comprising a container for mixing raw material of predetermined composition and heating and melting the same, a funnel or a pouring port for pouring the molten metal of the heat-melted raw material and a rotating disk made of silicon nitride or a material containing silicon nitride for scattering the poured molten metal.

4 Claims, 5 Drawing Sheets

FIG. 5

| | MOLTEN MATERIAL COMPOSITION | DISK MATERIAL | SPECIFIC GRAVITY (g/cm³) | THERMAL EXPANSION COEFFICIENT (× 10⁻⁶/°C) | BENDING STRENGTH (MPa) | OPERATION STABILITY | REACTIVITY | POWDER YIELD | MEAN GRAIN SIZE |
|---|---|---|---|---|---|---|---|---|---|
| EXAMPLE 1 | Bi₂(Te₀.₉Se₀.₁)₃ | Si₃N₄ | 3.2 | 2.2 | 820 | ○ | ○ | 95% | 25μm |
| EXAMPLE 2 | Bi₂(Te₀.₉Se₀.₁)₃ | SIALON | 3.2 | 2.2 | 820 | ○ | ○ | 93% | 27μm |
| EXAMPLE 3 | (Bi₀.₂₅Sb₀.₇₅)₂Te₃ | Si₃N₄ | 3.2 | 2.2 | 820 | ○ | ○ | 96% | 21μm |
| EXAMPLE 4 | (Bi₀.₂₅Sb₀.₇₅)₂Te₃ | SIALON | 3.2 | 2.2 | 820 | ○ | ○ | 95% | 22μm |
| COMPARATIVE EXAMPLE 1 | Bi₂(Te₀.₉Se₀.₁)₃ | Ti-6Al-4V | 4.4 | 8.4 | 700 | ○ | × | 85% | 30μm |
| COMPARATIVE EXAMPLE 2 | (Bi₀.₂₅Sb₀.₇₅)₂Te₃ | Ti-6Al-4V | 4.4 | 8.4 | 700 | ○ | × | 57% | 84μm |
| COMPARATIVE EXAMPLE 3 | Bi₂(Te₀.₉Se₀.₁)₃ | BN | 1.8 | 0.3 | 70 | × | ○ | 2% | — |
| COMPARATIVE EXAMPLE 4 | (Bi₀.₂₅Sb₀.₇₅)₂Te₃ | BN | 1.8 | 0.3 | 70 | × | ○ | 3% | — |
| COMPARATIVE EXAMPLE 5 | Bi₂(Te₀.₉Se₀.₁)₃ | GRAPHITE | 1.8 | 4 | 60 | × | ○ | 3% | — |
| COMPARATIVE EXAMPLE 6 | (Bi₀.₂₅Sb₀.₇₅)₂Te₃ | GRAPHITE | 1.8 | 4 | 60 | × | ○ | 3% | — |
| COMPARATIVE EXAMPLE 7 | Bi₂(Te₀.₉Se₀.₁)₃ | BN + Ti HOLDER | 4.4 | 8.4 | 700 | × | ○ | 65% | 70μm |
| COMPARATIVE EXAMPLE 8 | (Bi₀.₂₅Sb₀.₇₅)₂Te₃ | BN + Ti HOLDER | 4.4 | 8.4 | 700 | × | ○ | 58% | 73μm |
| COMPARATIVE EXAMPLE 9 | Bi₂(Te₀.₉Se₀.₁)₃ | GRAPHITE + Ti HOLDER | 4.4 | 8.4 | 700 | × | ○ | 67% | 62μm |
| COMPARATIVE EXAMPLE 10 | (Bi₀.₂₅Sb₀.₇₅)₂Te₃ | GRAPHITE + Ti HOLDER | 4.4 | 8.4 | 700 | × | ○ | 62% | 65μm |

OPERATION STABILITY
○: GOOD (VIBRATION NOT GENERATED)
×: VIBRATION GENERATED (MOTOR OVERLOADED, OR DISK RUPTURED)

REACTIVITY
○: NO REACTION WITH MOLTEN MATERIAL
×: REACTION CORROSION WITH MOLTEN MATERIAL OBSERVED

APPARATUS FOR FABRICATING POWDERY THERMOELECTRIC MATERIAL AND METHOD OF FABRICATING POWDERY THERMOELECTRIC MATERIAL USING THE SAME

BACKGROUND OF THE INVENTION

1. Field of the Invention

The present invention relates to an apparatus and method for fabricating a powdery thermoelectric material in order to fabricate a thermoelectric module that performs the conversion between thermal energy and electric energy.

2. Description of the Related Art

A "thermoelectric phenomenon" is the general term of the Seebeck effect, the Peltier effect and the Thomson effect, and elements utilizing the phenomenon are called a "thermoelectric element", a "thermocouple", an "electronic cooling element", etc. The thermoelectric phenomenon was originally discovered between different kinds of metals, but in recent years, thermoelectric materials of semiconductors have come to be obtained, and conversion efficiencies not observed with metal materials have come to be attained. Elements employing the thermoelectric semiconductor materials are structurally simple and easy of handling, and can maintain stable characteristics, so that their uses in a wide range attract public attention. In particular, since the elements are capable of precise temperature controls at and near the room temperature, researches and developments have been extensively promoted for temperature regulations in optoelectronics, semiconductor lasers, etc., and for applications to local cooling, small-sized refrigerators, etc.

In the fabrication of the thermoelectric element, a method of weighing capacity of raw materials to a desired composition, preparing a solid solution ingot by heat-melting and solidifying, further powdering the solid solution ingot and then sintering, slicing and dicing the same has been adopted so far. As a method of powdering the thermoelectric material in the process described above, there is a method of pulverizing the solid solution ingot and the resulting powder is classified by sieving. With this method, however, in order to pulverize solidified solid material, the powdery grains are in the shape of flakes. Therefore the loading of a sieve at the process of the classification and decrease of filling rate in the case where a die is filled up with the powder in order to mold it in the process of compressing the powder are occurred. In order to resolve such problems, there is a method of using a globular powdery thermoelectric material to fabricate a thermoelectric element. For example, Japanese Publication of Unexamined Patent Application, No.293276/1992 discloses a method of fabricating a globular powdery thermoelectric material. Heretofore, the globular powdery thermoelectric material has been obtained by a method referred to as a rotating disk method (or a centrifugal atomization method) of mixing and melting predetermined raw materials, and dropping to scatter the obtained molten metal onto a rotating disk manufactured from a metal (material) or a ceramic (material).

By the way, when a thermoelectric module is fabricated by using a globular powdery thermoelectric material, it has been known that the smaller the diameter of the powder is, the better performance of the module can be attained. In view of the above, for fabricating a fine powdery thermoelectric material with a diameter, for example, of 40 μm or less, the disk has to be rotated at a high speed.

In order to obtain a powdery thermoelectric material by a disk rotating at high speed, the disk has to satisfy various conditions. That is, the disk is imposed conditions that (1) it has a reduced weight and a sufficient mechanical strength so as to withstand high speed rotation, (2) it has heat resistance and thermal shock resistance capable of withstanding high temperature of the heat-melted thermoelectric material and has small coefficient of thermal expansion, (3) heat capacity of the entire disk is small in order to prevent the molten metal of the thermoelectric material from solidifying on the disk, and (4) the disk has less reactivity with the molten metal of thermoelectric material so as to avoid contamination of impurities into the thermoelectric material.

However, since conventional disks have large disk diameter and mass, it is difficult to rotate them at high speed. In addition, since metal or ceramic is used for the material of the disk, the heat capacity of the disk is large so that the molten metal of the thermoelectric material is deprived of its heat by the disk and the molten metal is easy to solidify on the disk. As a result, the disk is further increased in the weight and difficult to be rotated at high speed, and it is easy to get off the rotational balance of the disk. Further, this lowers the yield of the powdery thermoelectric material.

In order to improve these points (subjects), for example, when the weight of the disk is decreased for enabling high speed rotation and reducing the heat capacity, mechanical strength is lost since the thickness of the disk is decreased. On the contrary if it intends to maintain the mechanical strength, the inertial mass and the heat capacity of the disk are increased. Further, when a metal (material) is used as the material for the disk, since the coefficient of thermal expansion is large, the material is strained by thermal stress to possibly worsen the durability. Particularly, when iron or titanium is used as the material, since the material is highly reactive with the molten metal of the thermoelectric material, the composition of the thermoelectric material is changed. As described above, materials for a disk capable of satisfying all of said conditions have not yet been found so far.

In view of the above, it has been also practiced to manufacture a disk by a combination of two kinds of materials. For instance, Japanese Publication of Unexamined Patent Application No. 145710/1990 discloses a structure in which a metal disk is covered with a heat insulating material and the circumference thereof is held by a metal holder. Further, Japanese Publication of Unexamined Patent Application No. 34102/1995 discloses a structure in which a ceramic layer is disposed on the surface of a lightweight titanium alloy. However, in the conventional structures described above, since the disk is relatively larger, it can not be rotated at a high speed and the maximum rotational speed is, for example, at about 15,000 rpm, and the minimum grain size particle diameter can be reduced to no more than about 130 μm as well. Further, there is still left a problem that the molten metal is deprived of its heat by the disk and is easy to solidify on the disk to lower the powder yield.

OBJECT OF THE INVENTION

In view of the foregoings, this invention intends to provide a method of fabricating a powdery thermoelectric material and a manufacturing apparatus therefor capable of fabricating a fine powder at a high yield, when fabricating a powdery thermoelectric material by a rotating disk method, by adopting a disk using a material having a reduced weight and a high strength, with lower thermal expansion coefficient and less reactivity with the material, and designed so as to decrease the heat capacity, thereby preventing the molten metal from solidification and capable of fabricating a powder at high speed rotation. In view of the foregoing, it is an object of the present invention to provide a method of fabricating powdery thermoelectric material and an apparatus for fabricating powdery thermoelectric material which can prevent from solidifying the molten metal and fabricate a fine powder at a high yield, because of using the disk manufactured by the material which has lightweight, high mechanical strength, lower coefficient of thermal expansion and less reactivity with the materials and designed to less heat capacity when fabricating a powdery thermoelectric material by a rotating disk method.

SUMMARY OF THE INVENTION

The foregoing subjects can be solved in accordance with the present invention by an apparatus for fabricating a powdery thermoelectric material comprising a container for mixing raw material having a predetermined composition and heating and melting the same, a funnel or a pouring port for pouring the molten metal of the heated and melted raw material and a rotating disk made of silicon nitride or a material containing silicon nitride for scattering the poured molten metal. In order to solve the subjects mentioned above, an apparatus for fabricating a powdery thermoelectric material related to the present invention comprises a container for mixing and heat-melting a raw material of predetermined composition, a funnel or a pouring port for pouring the heat-melted raw material, and a rotating disk made of silicon nitride or a material containing silicon nitride for scattering the poured molten metal. The rotating disk may be manufactured from a material containing 90% or more of silicon nitride.

Further, the foregoing subjects can be solved in accordance with this invention by a method of fabricating a powdery thermoelectric material comprising mixing a raw material having a predetermined composition and heating and melting the same, pouring the molten metal of the heated and melted raw material on a rotating disk manufactured from silicon nitride or a material containing silicon nitride and scattering the poured molten metal by a rotating disk into fine globular forms and cooling them. Further a method of fabricating a powdery thermoelectric material which related to the present invention comprises the step of mixing and heat-melting a raw material of predetermined composition; the step of pouring the heat-melted raw material onto a rotating disk made of silicon nitride or a material containing silicon nitride; the step of turning the heat-melted material into microglobules by scattering and then cooling the microglobules, thereby to prepare a globular powdery thermoelectric material. The said rotating disk may be manufactured from a material containing 90% or more of silicon nitride.

BRIEF DESCRIPTION OF THE DRAWINGS

FIG. 5 is a table showing the result of an experiment for fabricating a powdery thermoelectric material by a rotating disk manufactured by using various kinds of materials.

Figure 1:
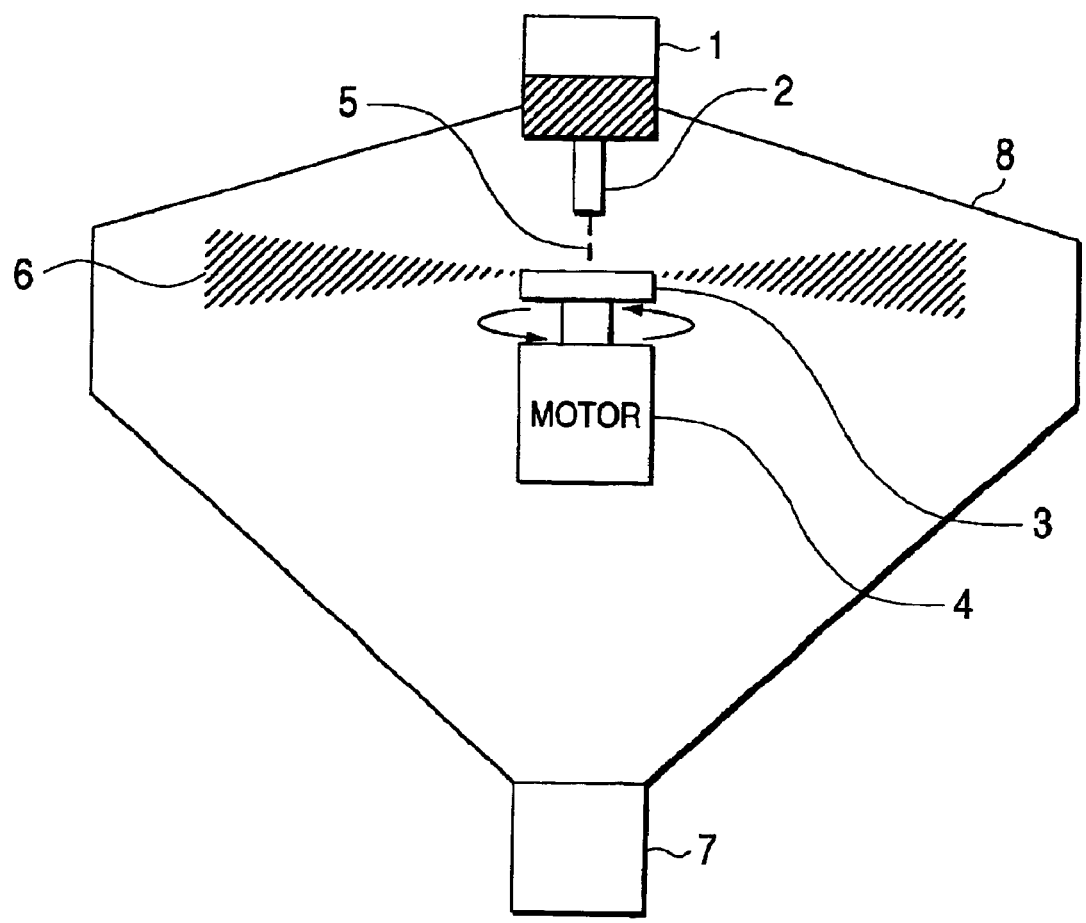
FIG. 1 is a schematic view showing an apparatus for fabricating a powdery thermoelectric material according to a preferred embodiment of the present invention.

DESCRIPTION OF PREFERRED EMBODIMENTS (This invention is to be described by way of preferred embodiments with reference to the drawings. Throughout the drawings, identical constituent elements carry the same reference numerals for which duplicate explanations are to be omitted.) Now, embodiments of the present invention will be described with reference to the drawings. By the way, same reference numbers shall be assigned to the same constituents, which shall be omitted from description.

FIG. 1 is a schematic view showing an apparatus for fabricating a powdery thermoelectric material in one embodiment according to this invention.

The apparatus includes a vessel 1 disposed in a chamber 8, a funnel 2, a rotating disk 3, a motor 4 and a powder collecting portion (unit) 7.

Figure 2:
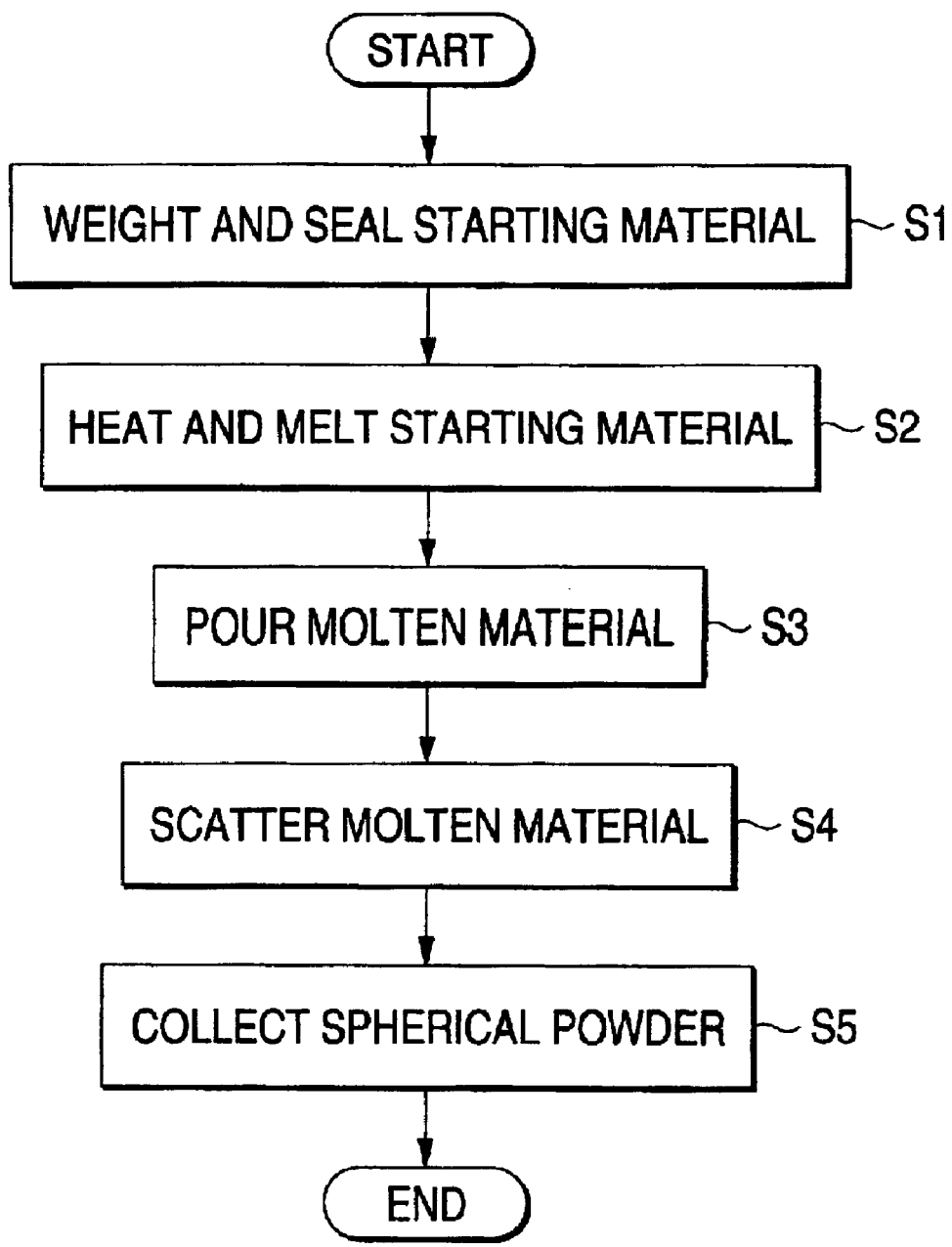
FIG. 2 is a flow chart showing a method of fabricating a powdery thermoelectric material according to a preferred embodiment of the present invention.

Further, FIG. 2 is a flow chart showing a method of fabricating a powdery thermoelectric material of one embodiment according to the present invention. The method of fabricating the powdery material in one embodiment according to this invention is to be explained with reference to FIG. 1 and FIG. 2.

At first, (or raw) material having a predetermined composition is weighed and is enclosed in a vessel 1 (step S1). The starting (or raw material of the thermoelectric material contains, for example, antimony (Sb) or bismuth (Bi) being a group V element and Selenium (Se) or tellurium (Te) being a group VI element. Since the solid solution of the group V and group VI elements has a hexagonal system (crystal) structure, at least two of elements among Bi, Te, Sb and Se are used as the raw materials generally represented as follows:

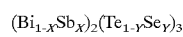

$$(Bi_{1-X}Sb_X)_2(Te_{1-Y}Se_Y)_3$$

in which $0 \leq X, Y \leq 1$

Specifically, a mixed crystal system solid solution of bismuth telluride ($Bi_2Te_3$) and antimony telluride ($Sb_2Te_3$) with addition of a P-type dopant can be used as the material for a P-type element, while a mixed crystal system solid solution of bismuth telluride ($Bi_2Te_3$) and bismuth selenide ($Bi_2Se_3$) with addition of an N-type dopant can be used as the material for a N-type element.

Then, the raw material enclosed in the vessel 1 is heat-melted by a radio frequency coil or a heater or the like (step S2). Further, the molten metal of the heat-melted raw material is poured through the funnel 2 on the rotating disk 3 (step S3). The rotating disk 3 is connected with the motor 4 and controlled for the rotational speed. The poured molten metal 5 is scattered by the rotating disk (step S4). The scattered molten metal 6 is cooled, dropped in the chamber 8 and then collected in the powder collecting portion (unit) 7 (step S5). For the method of pouring in step S3, the molten metal may be dripped dropwise or may be flowed continuously from a pouring port.

Figure 3:
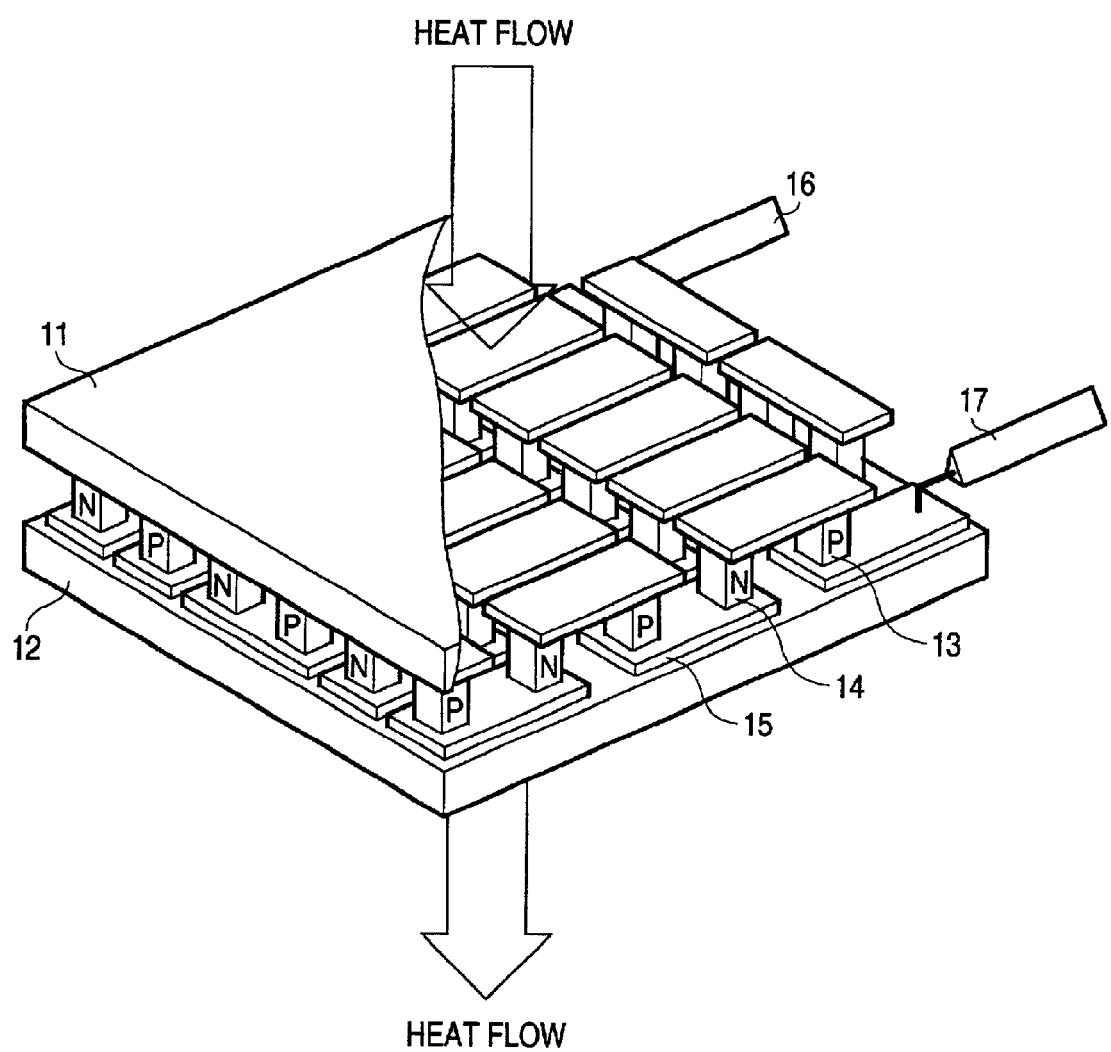
FIG. 3 is a perspective view, partially broken away, showing a structure of a thermoelectric module fabricated by using the powdery thermoelectric material prepared by the fabricating method according to the preferred embodiment of the present invention.

FIG. 3 is a perspective view, partially broken away, showing a thermoelectric module fabricated by using such a globular powdery thermoelectric material. As shown in FIG. 3, a P-type element (P-type semiconductor) 13 and an N-type element (N-type semiconductor) 14 are connected through an electrode 15 to form a PN element pair between two ceramic substrates 11 and 12. Further, a plurality of such PN element pairs are connected in series. A current introduction terminal (positive electrode) 16 is connected to the N-type element at one end of the series circuit of the PN element pairs, while a current introduction terminal (negative electrode) 17 is connected to the P-type element at the other end. When current is supplied from the current introduction terminal (positive electrode) 16 by way of the series circuit of the PN element pairs to the current introduction terminals (negative electrode) 17 by applying a voltage between the current introduction terminal 16 and 17, the side of the ceramic substrate 11 is cooled, while the side of the ceramic substrate 12 is heated. As a result, flow of heat as shown by an arrow in the figure is generated.

The figure of Merit Z indicating the performance of the thermoelectric material is represented by means of Seebeck coefficient α, electric conductivity σ, and thermal conductivity κ, as follows $$Z=\alpha^2\sigma/\kappa$$

Figure of Merit Z is higher, the performance of the thermoelectric material is better. The thermoelectric material is generally prepared from a sintered material and the heat conductivity can be decreased by reducing the crystal grain size of the sintered material finer. Accordingly, when the sintered material is prepared by using a fine powdery thermoelectric material fabricated in accordance with this invention, a thermoelectric material of a high Figure of Merit can be fabricated. That is, the performance of the thermoelectric material can be improved and the productivity of the high performance thermoelectric material can be improved.

Figure 4A:
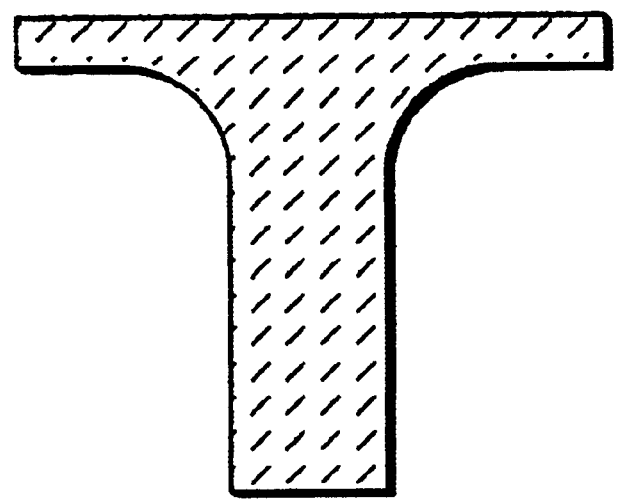
FIG. 4(A) is a view showing a cross sectional shape of a rotating disk used in a preferred embodiment according to the present invention.
Figure 4B:
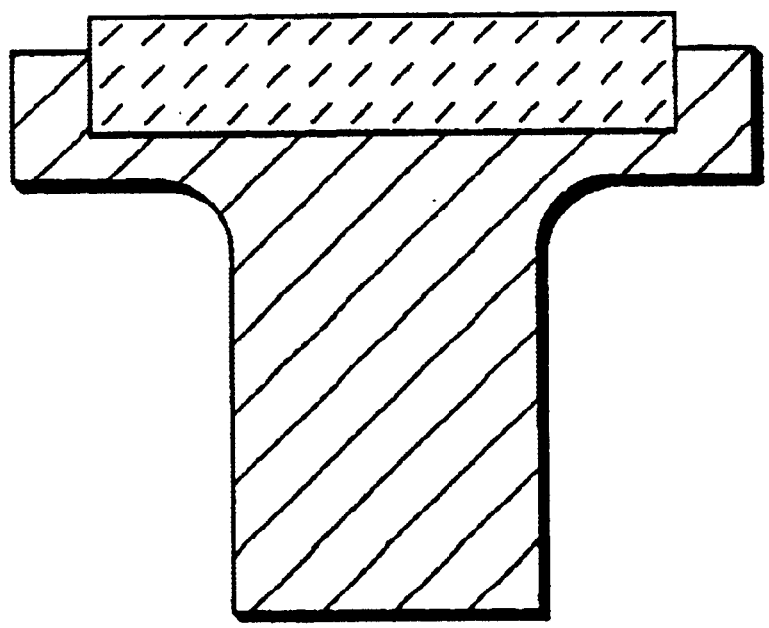
FIG. 4(B) is a view showing the shape of a rotating disk used in an experiment for comparing.

Then, the material and the shape of the rotating disk for using in the apparatus for manufacturing the globular powder according to this embodiment is to be explained. FIG. 4(A) is a cross sectional view showing the shape of a rotating disk for using in the apparatus for fabricating the globular powder according to this embodiment. Further, FIG. 4(B) is a cross sectional view showing the shape of a rotating disk used as a comparative example.

In order that the molten metal poured onto the rotating disk is not solidified on the disk, it is necessary to decrease the heat capacity of the rotating disk. This object can be attained by using a material of lower specific heat or reducing the weight of the rotating disk. Further, the diameter has also to be decreased for increasing the rotational speed. Then, when it is intended to manufacture a rotating disk of a reduced thickness and of a small diameter, this results in a problem of thermal shock. A problem of thermal shock is occurred next. That is, when the molten metal of the raw material melted and dropped on the disk is in contact with the upper surface of the disk, the temperature of the contact portion rises abruptly. Since the lower surface of the disk still remains momentarily at an initial temperature at this time, a temperature gradient is caused in the inside of the disk. As the temperature gradient is larger, the internal stress due to thermal expansion is larger tending to cause destruction, so that a disk is liable to be broken more easily as the distance between the upper surface and the lower surface is smaller, that is, as the thickness is reduced.

In order to manufacture a disk having durability against thermal shock and having a reduced thickness, a material of a small coefficient of thermal expansion may be used. Alternatively, a material having a strength to endure the stress may also be used.

In the present invention, a material containing silicon nitride or sialon is used for manufacturing the rotating disk.

Silicon nitride or sialon is a material having a same extent of specific heat as that of metals or ceramics but has small coefficient of thermal expansion and thermal stress. On the contrary, the bending strength is not lower even when compared with other materials.

Sialon is a mixture of silicon nitride mixed with aluminum oxide and other material and it is generally represented as β-sialon as below:

$$Si_{6-Z}N_{8-Z}Al_ZO_Z$$

in which the value for Z is preferably within a range from 0 to 3.8. In this embodiment, β-sialon in which Z≅0.34 was used. In this case, since the molecular weight for $Si_{6-Z}N_{8-Z}$ is 266.2 and the molecular weight for $Si_{6-Z}N_{8-Z}Al_ZO_Z$ is 280.8, the ratio of silicon nitride $Si_{43}N_4$ contained in the β-sialon is 94.8% being calculated as:

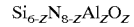

Further, in this embodiment, about 90% of the sialon mixed with about 10% of yttrium oxide $Y_2O_3$ or $SiO_2$ glass was used as the material for the rotating disk. Accordingly, the ratio of silicon nitride $Si_3N_4$ to the entire material is 85.3 % being calculated as:

$$94.8 \times 0.9 = 85.3$$

FIG. 5 shows a result of an experiment for comparing in which powdery thermoelectric materials were fabricated by using rotating disks related to the embodiment of the present invention manufactured from silicon nitride or sialon and rotating disks of comparative examples manufactured from conventional materials. In Examples 1 to 4, a rotating disk of the shape shown in FIG. 4(A) was used. The operation was conducted under the conditions at a diameter of the rotating disk of 30 mm, rotational speed of 60,000 rpm, a molten metal temperature of 720° C. and a molten metal amount of 2 kg. Further, regarding the composition of the thermoelectric material, there were used two kinds of materials namely, a mixed crystal solid solution of bismuth telluride and bismuth selenide: $Bi_2(Te_{0.9}Se_{0.1})_3$ as the raw material for the N-type element, and a mixed crystal solid solution of bismuth telluride and antimony telluride: $(Bi_{0.25}Sb_{0.75})_2Te_3$ as the raw material for the P-type element.

The material and the shape of the rotating disks used for comparison are to be explained. As shown in FIG. 5, an experiment for comparing was conducted by using the rotating disk of the shape shown in FIG. 4(A) manufactured from each of titanium-aluminum-vanadium series alloy, boron nitride and graphite respectively shown in Comparative Examples 1 to 6. Further, for fragile boron nitride and graphite in view of the result of the experiment, a holder made of titanium was attached to a disk made of boron nitride or graphite as shown in FIG. 4(B) as Comparative Examples 7 to 10.

Then, the result of experiment is to be studied (examined) with reference to FIG. 5.

At first, taking notice on Comparative Examples 1 and 2, since rotating disks made of titanium-aluminum-vanadium series alloy had high coefficient of thermal expansion but, on the other hand, the bending strength was also large, it could endure thermal shock and high speed rotation. However, since the ingredients contained in the alloy are reactive with the molten metal of the raw material, reaction corrosion was observed on the surface of the rotating disk. Accordingly, the fabricated powder can not be used. Particularly, in Comparative Example 2, the disk was abraded by heavy corrosion.

Then, taking notice on boron nitride and graphite shown in Comparative Examples 3 to 6, the rotating disks using the materials were poor in the operation stability and the powder yield was as low as 2 to 3%. Further, the average particle diameter could not be measured. This is because the bending strength is lower against the thermal expansion thereof and, accordingly, the disk is damaged instantly upon pouring of the molten metal and the powder was scarcely fabricated. In view of the above, a titanium holder was attached to boron nitride and graphite in Comparative Examples 7–10. While the mechanical strength of the rotating disk could be maintained by this measure, the mass and the heat capacity of the rotating disk also are increased and the molten metal tends to be solidified on the disk. When the molten metal was solidified, the operation stability was also lowered such as occurrence of vibrations and the powder yield was also poor as shown in Comparative Examples 7 to 10. Further, the average particle diameter was about 70 μm.

Compared with the comparative examples described above, since the rotating disks of the examples using silicon nitride and sialon as the material had small coefficient of heat expansion and large bending strength, they could endure the thermal shock sufficiently even when the thickness of the disk was reduced. Further, since the specific gravity is not large even compared with metals or the like, the heat capacity was not increased so much and the poured molten metal was less solidified on the disk. Accordingly, a long-time operation stability was kept. Further, since the shape for the reduced size and weight could be maintained, high speed operation could be maintained and the powder of small grain size could be fabricated at a good yield. As described above, satisfactory result could be obtained by using rotating disks made of silicon nitride or sialon as the material.

As has been described above, according to the present invention, a powdery thermoelectric material of smaller average particle diameter than usual can be fabricated at a good yield by using a rotating disk manufactured from a material containing silicon nitride in the manufacture of the powdery thermoelectric material by a rotating disk method. Accordingly, the performance and the productivity of the thermoelectric element can be improved.

What is claimed is:

1. An apparatus for fabricating a thermoelectric material comprising:
   a container for mixing and heat-melting raw material having a predetermined composition;
   means for pouring the molten metal of the heat-melted raw material; and
   a rotating disk for scattering the poured molten metal;
   wherein the rotating disk has a disk and a stem, and the disk and the stem have a uniform integral structure made of silicone nitride or a material containing silicon nitride.

2. An apparatus for fabricating a thermoelectric material as defined in claim 1, wherein means for pouring the molten metal of the heat-melted raw material includes a funnel.

3. An apparatus for fabricating a thermoelectric material as defined in claim 1, wherein means for pouring the molten metal of the heat-melted raw material includes a pouring port.

4. An apparatus for fabricating a thermoelectric material comprising:
   a container for mixing and heat-melting raw material having a predetermined composition;
   means for pouring the molten metal of the heat-melted raw material; and
   a rotating disk for scattering the poured molten metal;
   wherein the rotating disk has a disk and a stem, and the disk and the stem have a uniform integral structure made of β-sialon having the formula:

$$Si_{6-z}N_{8-z}Al_zO_z$$

wherein $Z \leq 3.8$.

* * * * *